United States Patent
Hatanaka (10) Patent No.: US 8,380,479 B2
(45) Date of Patent: Feb. 19, 2013

(54) MODEL PARAMETER EXTRACTING APPARATUS AND MODEL PARAMETER EXTRACTING PROGRAM FOR SEMICONDUCTOR DEVICE MODEL

(75) Inventor: Yuukichi Hatanaka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 638 days.

(21) Appl. No.: 12/613,215

(22) Filed: Nov. 5, 2009

(65) Prior Publication Data

US 2010/0125442 A1    May 20, 2010

(30) Foreign Application Priority Data

Nov. 20, 2008    (JP) .................. 2008-296576

(51) Int. Cl.
 *G06F 17/50*    (2006.01)
(52) U.S. Cl. ........................................ 703/14
(58) Field of Classification Search ............... 703/2, 13, 703/14; 716/2, 4, 21; 250/208.1
See application file for complete search history.

(56) References Cited

U.S. PATENT DOCUMENTS

| | | | |
|---|---|---|---|
| 7,219,045 B1 * | 5/2007 | Wu et al. .................. | 703/14 |
| 7,567,891 B1 * | 7/2009 | Liu et al. .................. | 703/13 |
| 2003/0220779 A1 * | 11/2003 | Chen et al. ................ | 703/14 |
| 2005/0027501 A1 * | 2/2005 | Chen et al. ................ | 703/14 |
| 2005/0086033 A1 * | 4/2005 | Chen et al. ................ | 703/2 |
| 2005/0235246 A1 * | 10/2005 | Smith et al. ............... | 716/21 |
| 2006/0000964 A1 * | 1/2006 | Ye et al. ................... | 250/208.1 |
| 2007/0157139 A1 * | 7/2007 | White et al. ............... | 716/4 |
| 2009/0031261 A1 * | 1/2009 | Smith et al. ............... | 716/2 |
| 2011/0106497 A1 * | 5/2011 | Visweswariah et al. ...... | 702/182 |

FOREIGN PATENT DOCUMENTS

JP    2001-119017 A    4/2001

OTHER PUBLICATIONS

Mutulu et al., "Statistical methods for estimation of process variation effects on computer operation", IEEE 2005.*
Schroter et al., "Physics based minority charge and transit time modeling for bipolar transistors", IEEE 1999.*
Bning et al., "Model of process variations in device and interconnect", Aug. 1999.*
Orshansky, M., "Increasing current performance through statistical design technique", U.C. Berkeley, 2004.*
Raghavan et al., "Modeling and design techniques for RF power amplifiers", Jun. 2007.*
Park, T.H., "Characterization and modeling of Pattern dependencies in copper interconnects for integrated circuits", MIT 1998.*
Naidu, S.R., "Tuning for yield: Towards predictable deep-submicron manufacturing", 2004.*

* cited by examiner

*Primary Examiner* — Kandasamy Thangavelu
(74) *Attorney, Agent, or Firm* — Foley & Lardner LLP (57) ABSTRACT

A model parameter extracting apparatus includes: a binning processor for carrying out a binning process; and a model parameter extractor for extracting a model parameter for each of multiple bins formed by the binning process. The model parameter extractor extracts a first model parameter corresponding to a first end portion of a target bin. Based on the first model parameter, the model parameter extractor sets up a candidate for a second model parameter corresponding to a second end portion of the target bin. Subsequently, based on the first model parameter and the candidate for the second model parameter, the model parameter extractor finds a start-point-side gradient and an end-point-side gradient of a limited curve representing an electric characteristic of a semiconductor device. Then, based on a result of a comparison between the gradients, the model parameter extractor extracts the second model parameter.

16 Claims, 12 Drawing Sheets

DIFFERENCE IN GRADIENT BETWEEN POINT A AND POINT B IS LARGER WHEN MODEL TRAIT HAS DEFLECTION

FIG. 4C

DIFFERENCE IN GRADIENT BETWEEN POINT A AND POINT B IS SMALLER WHEN MODEL TRAIT IS CLOSER TO EXPECTED CHARACTERISTIC

| ARBITRARY VALUE P2B' OF SHIFT WIDTH OF P2 | PARAMETER P2 AT POINT A | INTERPOLATION PARAMETER |
|---|---|---|
| P2miin | P2A | P2_0_0, P2_L_0 |
| P2min+1 * ΔP2 | P2A | P2_0_1, P2_L_1 |
| P2min+2 * ΔP2 | P2A | P2_0_2, P2_L_2 |
| . . . . | . . . . | . . . . |
| P2min+(i-1) * ΔP2 | P2A | P2_0_i, P2_L_i |
| . . . . | . . . . | . . . . |
| P2max | P2A | P2_0(N-1), P2_L(N-1) |

| ARBITRARY VALUE P2B' OF SHIFT WIDTH OF P2 | GRADIENT Ma OF ELECTRIC CHARACTERISTIC AT POINT A | GRADIENT Mb OF ELECTRIC CHARACTERISTIC AT POINT B | RATIO BETWEEN GRADIENTS OF ELECTRIC CHARACTERISTICS RM=Ma/Mb |
|---|---|---|---|
| P2min | Ma_p2_0 | Mb_p2_0 | RM_p2_0 |
| P2min+1*ΔP2 | Ma_p2_1 | Mb_p2_1 | RM_p2_1 |
| P2min+2*ΔP2 | Ma_p2_2 | Mb_p2_2 | RM_p2_2 |
| ... | ... | ... | ... |
| P2min+i*ΔP2 | Ma_p2_i | Mb_p2_i | RM_p2_i |
| ... | ... | ... | ... |
| P2max | Ma_p2_(N-1) | Mb_p2_(N-1) | RM_p2_(N-1) |

MODEL PARAMETER EXTRACTING APPARATUS AND MODEL PARAMETER EXTRACTING PROGRAM FOR SEMICONDUCTOR DEVICE MODEL

BACKGROUND OF THE INVENTION

1. Field of the Invention

The present invention relates to a model parameter extracting apparatus and a model parameter extracting program for a semiconductor device model.

2. Description of the Related Art

A circuit simulation using a circuit simulator is carried out when LSI circuits are designed. In the circuit simulation, a semiconductor device model is assigned a model parameter (a device parameter) thereby to show the characteristic of the semiconductor device. Thereby, the operation of the circuit is calculated in a simulated manner. The accuracy and reliability of the circuit simulation is determined by the setting of the model parameter assigned to the semiconductor device model.

Many device model parameters are provided for device models such as Berkeley short-channel insulated gate field effect transistor (IGFET) model (BSIM). The values of these device model parameters need be adjusted in advance so as to minimize the error between an actual current-voltage characteristic of a transistor and a current-voltage characteristic calculated by a circuit simulation. Work for this adjustment is termed as "parameter extraction" or "tuning."

A technology of extracting a model parameter accurately representing the characteristic of a semiconductor device is known (see, for instance, Japanese Patent Application Publication No. 2001-119017 (referred to as Patent Document 1 below)). Patent Document 1 discloses a binning technology in which the area of a device having a gate length L and a gate width W is divided by a lattice into sub-areas termed as "bins" (containers).

A binning technology disclosed in Patent Document 1 is implemented as follows. First, for each of MOSFETs having different gate lengths, a direct current-DC voltage characteristic is measured, and a threshold voltage is calculated from the direct current-DC voltage characteristic thus obtained. Then, for each MOSFET, a channel resistance is measured. Thereafter, an Rd-L characteristic representing a relationship between the channel resistance and the gate length is calculated from the calculated threshold voltage and the measured value of the channel resistance. Then, a linear approximation is applied to the Rd-L characteristics of the respective MOSFETs with respect to the gate length. When a straight line is obtained for a model parameter for each effective gate bias voltage, a global straight line gradient value calculator 31 calculates a gradient value of a global straight line which is obtained by applying the linear approximation to the Rd-L characteristic with respect to all the gate lengths. Subsequently, a local straight line gradient value calculator 32 calculates a gradient value of each local straight line between adjacent measurement points of the channel resistance. Thereafter, a gradient value crossover point detector 33 finds a crossover point between the adjacent gradient value of the local straight line, and the gradient value of the global straight line, and thereby detects the gate length corresponding to this crossover point, as a gate length in which the measurement value of the channel resistance deviates from the model parameter.

The binning technology reproduces the current-voltage characteristic with accuracy as follows. For each bin, a model parameter is extracted from data on the current-voltage characteristic of an area of the bin. Thereby, all the bins are provided with their respective model parameters. When a circuit simulation is carried out, these multiple model parameters are properly applied to right areas with the gate lengths L corresponding to the bins, respectively.

In general, whether or not each extracted model parameter is suitable is verified by use of a circuit simulator. The circuit simulator can show an electric characteristic of a semiconductor device on the basis of the extracted model parameter. Whether or not the extracted model parameter is suitable is verified on the basis of whether or not an electric characteristic reproduced by the circuit simulator accurately represents the actual electric characteristic of the semiconductor device.

Figure 1A:
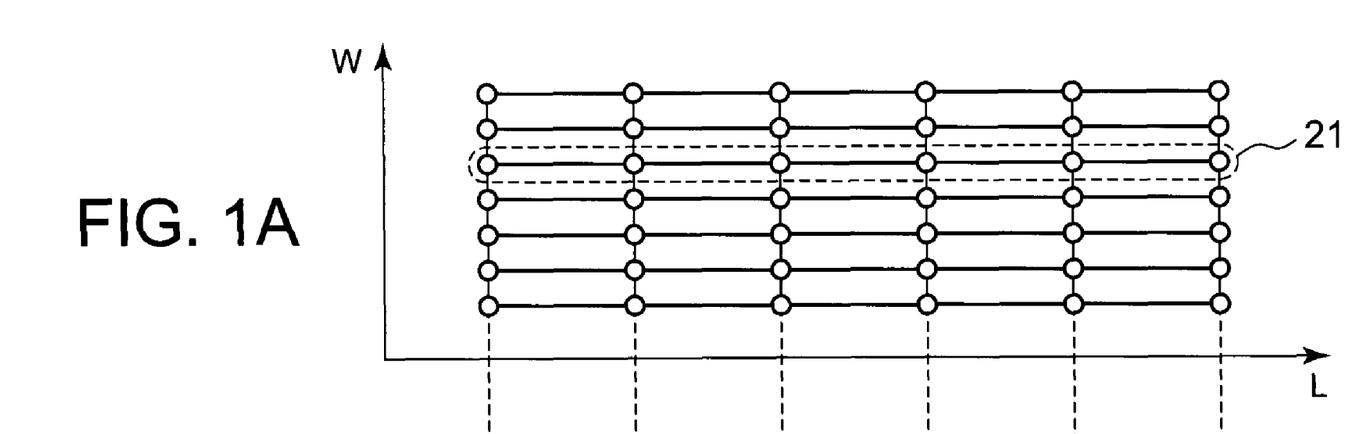
FIGS. 1A and 1B are diagrams each showing a result of verification using a conventional circuit simulator.
Figure 1B:
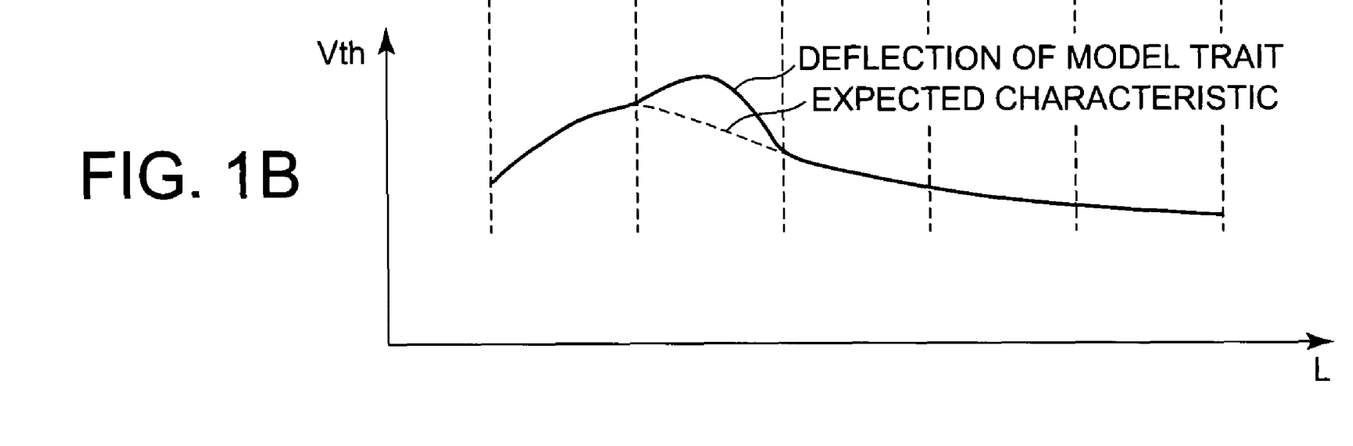

FIGS. 1A and 1B are diagrams showing a result of verification using a conventional circuit simulator. FIG. 1B is a diagram showing a reproduced electric characteristic of a semiconductor device model for an area 21 shown in FIG. 1A. Conventionally, when some part of the reproduced electric characteristic of the semiconductor device model is found to deviate from an expected characteristic (hereinafter the deviating part will be referred to as "deflection of the model trait"), a model parameter is extracted again.

In the conventional technology, a model parameter is repeatedly extracted until the extracted model parameter accurately reproduces the actual characteristic of the semiconductor device. For this reason, the extracted model parameter can reproduce the current-voltage characteristic of the semiconductor device accurately. However, the verification using the circuit simulator for the extraction is complicated and very time consuming. Furthermore, whether or not a more suitable model parameter, which eliminates deflection of the model trait, can be extracted after the verification using the circuit simulator depends on the skill level of a person in charge of the extraction.

SUMMARY

An objective of the present invention is to provide a technology which makes it possible to automatically extract a model parameter which eliminates the deflection of the model trait within a short time without depending on the skill of a user.

Using the reference numerals used in a section entitled "DESCRIPTION OF THE PREFERRED EMBODIMENT," descriptions will be hereinbelow provided for the means for solving the problem. The reference numerals are added to clarify a corresponding relationship between the descriptions in a section entitled "What is claimed is" and the descriptions in the section entitled "DESCRIPTION OF THE PREFERRED EMBODIMENT". These reference numerals shall not be used to interpret the technical scope of the present invention which is described in the section entitled "What is claimed is."

To solve the above-described problem, a model parameter extracting apparatus (1) includes: a binning processor configured to carry out a binning process for limiting an effective range of a semiconductor device model used in a circuit simulation; and a model parameter extractor configured to extract a model parameter used in the circuit simulation, for each of multiple bins formed by the binning process.

The model parameter extractor selects one of the multiple bins as a target bin, and extracts a first model parameter for predicting an electric characteristic of a semiconductor device at a first end portion of the target bin. In addition, based on the first model parameter, the model parameter extractor sets up a candidate for a second model parameter for predicting an electric characteristic of the semiconductor device at a second end portion of the target bin. Furthermore, based on the first model parameter and the candidate for the second model parameter, the model parameter extractor calculates a limited curve representing the electric characteristic of the semiconductor device.

In this respect, the model parameter extractor finds: a start-point-side gradient representing a gradient of a tangent line of the limited curve including a start point; and an end-point-side gradient representing a gradient of a tangent line of the limited curve including an end point. Thus, based on a result of a comparison between the start-point-side gradient and the end-point-side gradient, the model parameter extractor extracts the second model parameter.

A typical effect offered by the invention disclosed herein can be briefly described as follows. The present invention makes it possible to extract a model parameter, which eliminates the deflection of the model trait, without depending on the skill of a user.

DESCRIPTION OF THE PREFERRED EMBODIMENT

Descriptions will be hereinbelow provided for an embodiment of the present invention on the basis of the drawings. The same parts will be denoted by the same reference numerals throughout the drawings used to explain the embodiment, and duplicated explanations will be omitted.

Figure 2:
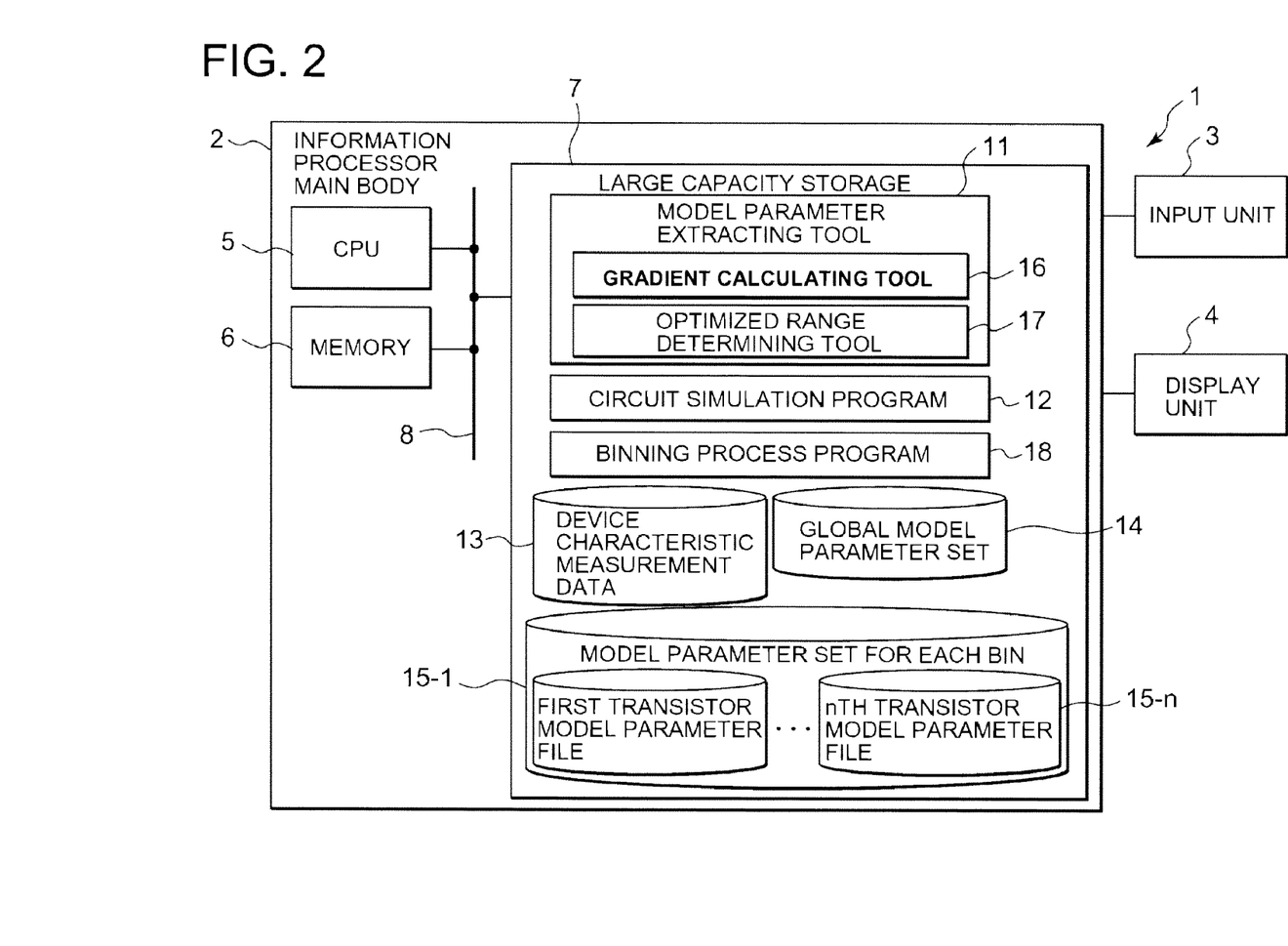
FIG. 2 is a block diagram exemplifying a configuration of a parameter extracting apparatus according to the present embodiment.

FIG. 2 is a block diagram exemplifying a configuration of a parameter extracting apparatus 1 according to the present embodiment. The parameter extracting apparatus 1 according to the present embodiment corresponds to a model parameter extracting tool 11, which will be described later, and implements a function as a model parameter extracting apparatus. In addition, the parameter extracting apparatus 1 implements a function as an apparatus for making a simulation by use of a circuit simulation program 12, which will be described later.

A general device model is expressed with complicated mathematical formulas each including a large number of device model parameters. To make each device model parameter represent a value accurately characterizing a physical phenomenon, the parameter needs to be extracted properly. The parameter extracting apparatus 1 of the present embodiment extracts the parameters with high accuracy in a short time.

As shown in FIG. 2, the parameter extracting apparatus 1 according to the present embodiment includes an information processor main body 2, an input unit 3 and a display unit 4. They are connected to one another so that data can be communicated among them. The information processor main body 2 is a high-speed arithmetic processing unit typified by a personal computer, a workstation or the like. The input unit 3 is a man-machine interface including a function of inputting data into the information processor main body 2. Typical examples of the input unit 3 are a keyboard, a mouse and the like. The following descriptions for the embodiment will be given taking an example in which the input unit 3 is a keyboard. The display unit 4 is a man-machine interface including a function of externally outputting a result of a process carried out by the information processor main body 2. Typical examples of the display unit 4 are a CRT and a liquid crystal display. The following descriptions for the embodiment will be given taking an example in which the display unit 4 is a liquid crystal display visually displaying extracted parameter values and simulation results.

The information processor main body 2 includes a CPU (Central Processing Unit) 5, a memory 6, and a large capacity storage 7. They are connected to one another through a bus 8. The CPU 5 is an arithmetic processing unit configured to control the various units included in a circuit simulation apparatus 10 and to process data inputted into, and outputted from, the information processor main body 2. The CPU 5 interprets data received from the input unit 3 and the like, performs arithmetic computations on the data thus interpreted, and displays an arithmetic result on the display unit 4 and the like. The memory 6 is a storage medium to and from which data can be written and read. Typical examples of the memory 6 are an SDRAM, a DDR-SDRAM, and the like. Data communications carried out among the input unit 3, the display unit 4 and the information processor main body 2 are controlled through an input-output interface. The large capacity storage 7 is a unit for recording a large amount of data in a storage medium. Typical examples of the large capacity storage 7 are an HDD (Hard Disk Drive) and the like.

The large capacity storage 7 includes the model parameter extracting tool 11, the circuit simulation program 12, a device characteristic measurement data 13, a global model parameter set 14, a model parameter set 15 for each bin, and a binning process program 18.

In the present embodiment, the model parameter extracting tool 11 is an EDA tool configured to provide a function of extracting a model parameter. The circuit simulation program 12 is a tool configured to provide a function of predicting an electric characteristic of a semiconductor device by use of the model parameter extracted by the model parameter extracting tool 11. The binning process program 18 instructs a procedure for a binning process carried out in extracting model parameter.

The device characteristic measurement data 13 is data on an actual current-voltage characteristic and the like of each transistor. The global model parameter set 14 is a set of model parameters used to averagely reproduce an electric characteristic of multiple transistors which are different from one another in gate length L and gate width W.

The model parameter set 15 for each bin is a parameter set generated by the model parameter extracting tool 11 according to the present embodiment. The model parameter set 15 for each bin includes model parameters (a first transistor model parameter file 15-1 to an nth transistor model parameter file 15-n (n is any natural number)) which correspond to the respective boundary points (hereinafter referred to as "lattice points") between the bins formed by the binning process.

In addition, the model parameter extracting tool 11 according to the present embodiment includes a gradient calculating tool 16 and an optimized range determining tool 17. Detailed descriptions will be provided later for functions offered by the gradient calculating tool 16 and the optimized range determining tool 17.

Figure 3:
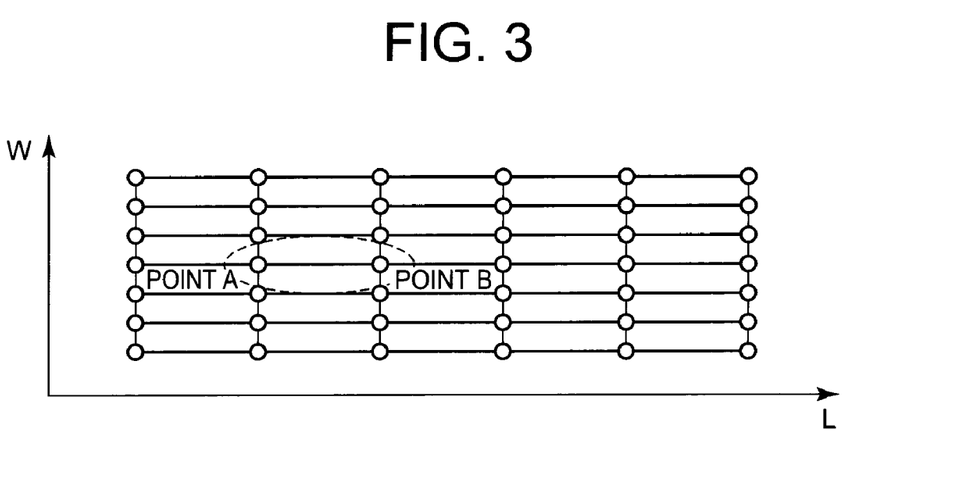
FIG. 3 is a diagram conceptually exemplifying a process carried out by a binning process program.

FIG. 3 is a diagram conceptually exemplifying a process which is carried out by the binning process program 18 included in the parameter extracting apparatus 1 according to the present embodiment. In accordance with the procedure instructed by the binning process program 18, the parameter extracting apparatus 1 divides a distribution of components which determine the characteristic of the semiconductor device into areas termed as bins (containers) by applying a lattice to the distribution. FIG. 3 exemplifies how an area, of a transistor, with a gate length L and a gate width W is divided into bins.

A point A in FIG. 3 corresponds to a transistor (a semiconductor device) with a gate width Wi and a gate length LA. A point B in FIG. 3 corresponds to a transistor (a semiconductor device) with a gate width Wi and a gate length LB.

Figure 4A:
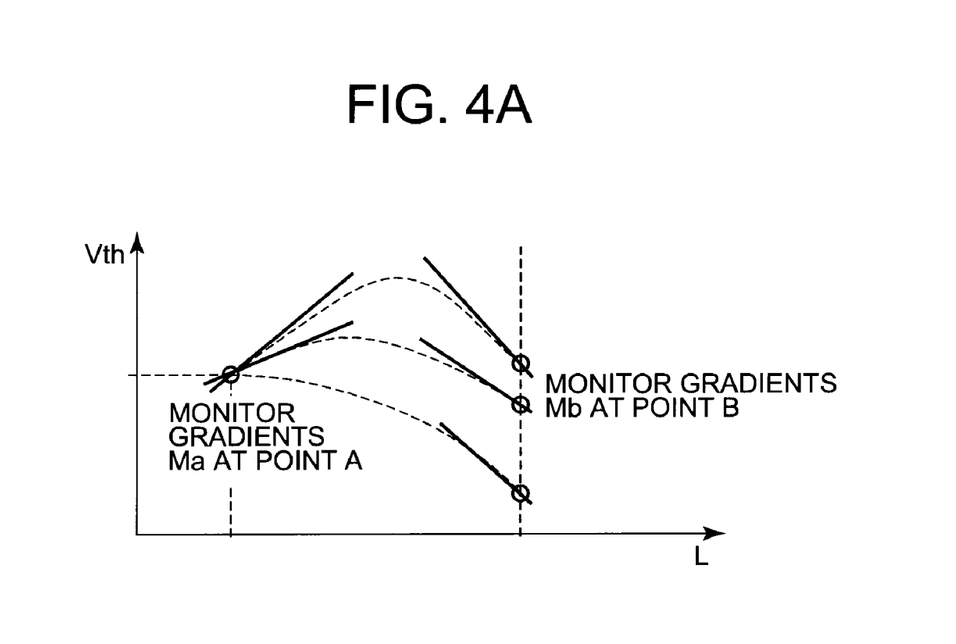
FIG. 4A is a diagram conceptually exemplifying a model parameter extracting operation of the present embodiment.

FIG. 4A is a diagram conceptually exemplifying how the parameter extracting apparatus 1 according to the present embodiment carries out a model parameter extracting operation. FIG. 4A exemplifies a relationship between a gate length and a threshold voltage of a transistor. In accordance with a procedure instructed by the model parameter extracting tool 11, the parameter extracting apparatus 1 according to the present embodiment selects one lattice point (hereinafter referred to as a "reference lattice point") out of the lattice points between the bins which are formed corresponding to a binning technique. On the basis of a model parameter extracted at the reference lattice point thus located, the parameter extracting apparatus 1 extracts model parameters corresponding to a lattice point adjacent to the reference lattice point (hereinafter referred to as an "adjacent point."

In this respect, the parameter extracting apparatus 1 extracts the multiple model parameters so that the characteristic (threshold voltage) of the transistor which corresponds to the adjacent point can be variable in a predetermined range. In accordance with a procedure instructed by the circuit simulation program 12, the parameter extracting apparatus 1 calculates, for each of the multiple model parameters, a curve representing the electric characteristic. Thereafter, in accordance with a procedure instructed by the gradient calculating tool 16 included in the model parameter extracting tool 11, the parameter extracting apparatus 1 finds, for each of the multiple curves, a tangent line at the reference lattice point and a tangent line at the adjacent point. In accordance with a procedure instructed by the optimized range determining tool 17 included in the model parameter tool 11, the parameter extracting apparatus 1 optimizes a range from which to extract a model parameter on the basis of the tangent line at the reference lattice point and the tangent lines at the respective adjacent points.

Figure 4B:
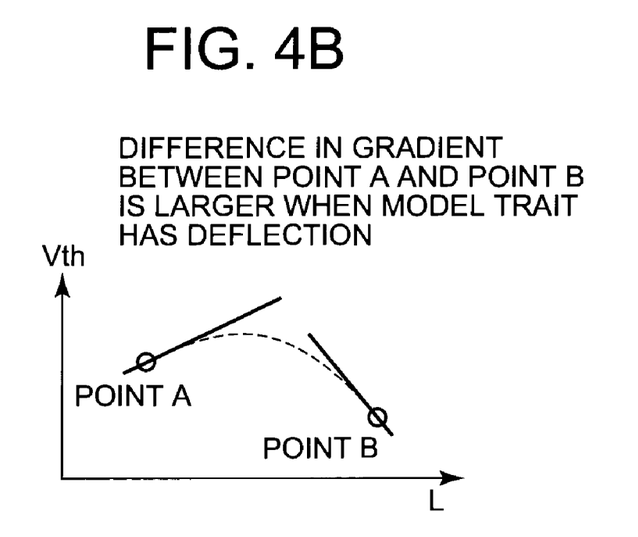
FIG. 4B is a diagram exemplifying a case where a curve represents a deflection of the electric characteristic.

FIG. 4B is a diagram exemplifying how two tangent lines are when a calculated curve representing an electric characteristic deviates from an expected electric characteristic, and thus has a deflection of the electric characteristic. When the curve has a deflection of the electric characteristic, as shown in FIG. 4B, the difference in gradient is larger between the tangent line at the reference lattice point and the tangent line at the adjacent point.

Figure 4C:
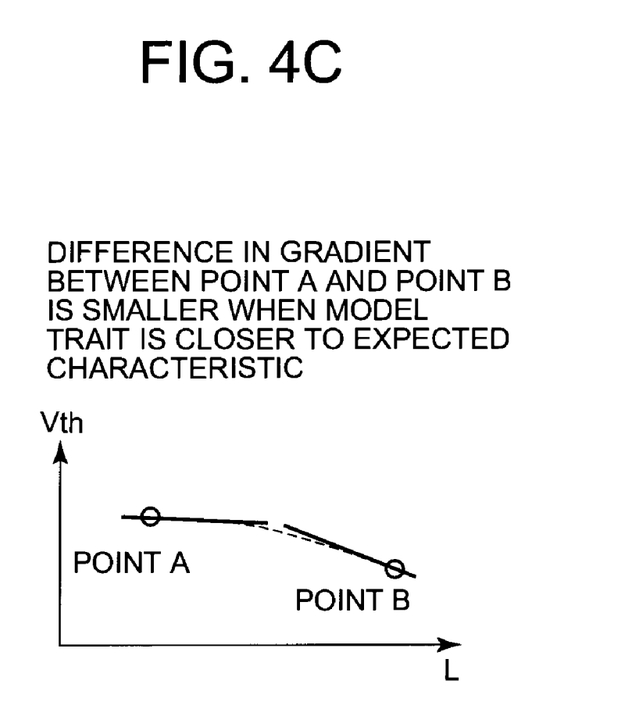
FIG. 4C is a diagram exemplifying a case where the curve is close to an expected electric characteristic.

FIG. 4C is a diagram exemplifying how two tangent lines are when a calculated curve representing an electric characteristic is close to an expected electric characteristic. As shown in FIG. 4C, when the curve agrees with, or close to, the expected electric characteristic, the difference in gradient is smaller between the tangent line at the reference lattice point and the tangent line at the adjacent point. In addition, when the curve has no deflection of the electric characteristic, no difference in gradient exists between the two tangent lines, and a ratio therebetween is 1.

Out of the multiple curves calculated on the basis of the multiple model parameters corresponding to the respective adjacent points, the parameter extracting apparatus 1 seeks out a model parameter which makes the difference in gradient between the tangent line at the reference lattice point and the tangent line at the adjacent point the smallest.

Figure 5:
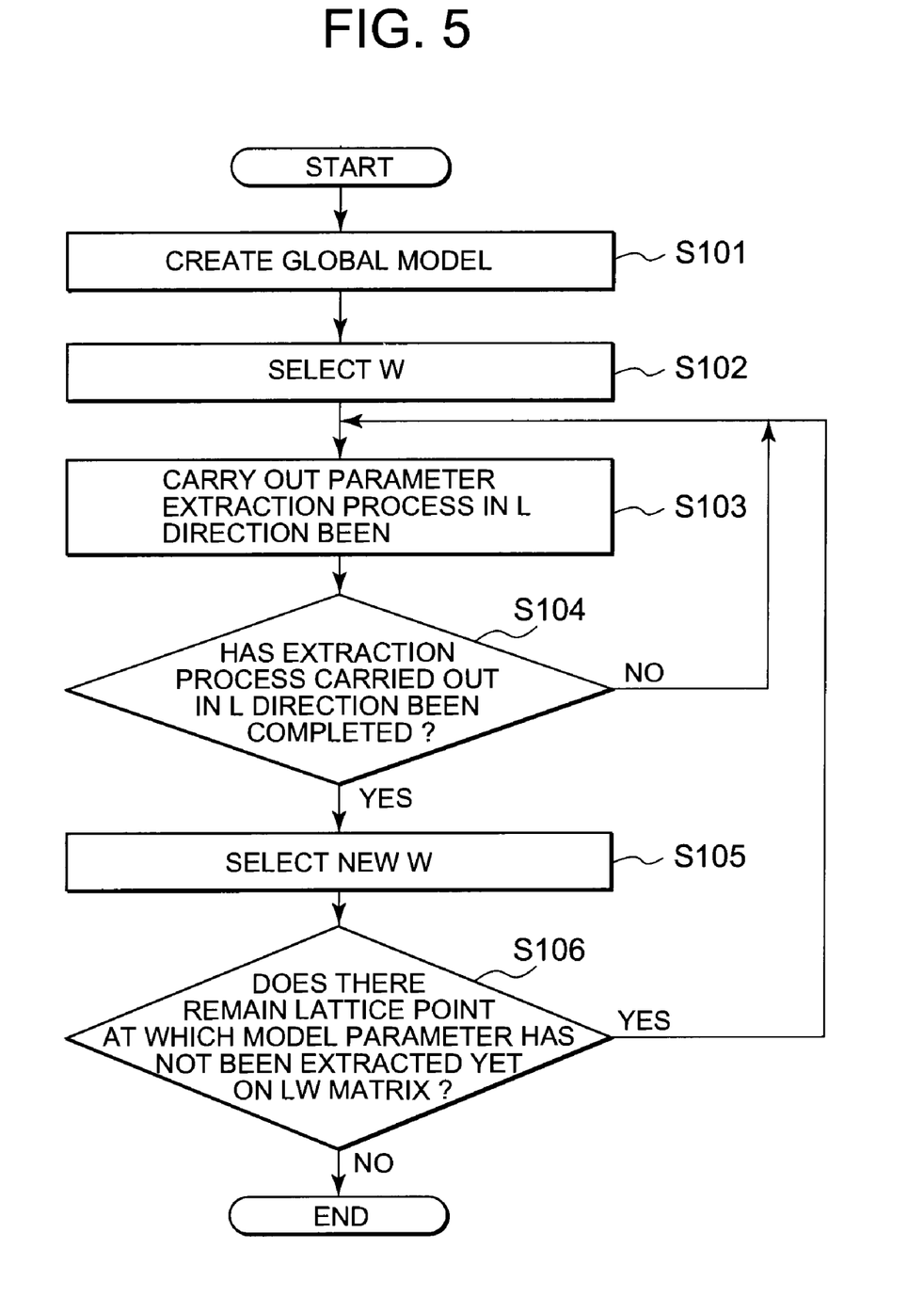
FIG. 5 is a flowchart exemplifying an overall operation of the parameter extracting apparatus.

Referring to the drawings, concrete descriptions will be hereinbelow provided for a detailed operation of the parameter extracting apparatus 1 according to the present embodiment. FIG. 5 is a flowchart exemplifying an overall operation of the parameter extracting apparatus 1. The operation shown in FIG. 5 is carried out after completion of the binning process carried out by the binning process program 18. In addition, what is described in the following embodiment as an example is the model parameter extracting operation performed in a case where the binning process has been applied to an area with the gate length L and the gate width W of each of transistors having different gate lengths L and gate widths W.

In step S101, in accordance with the procedure instructed by the model parameter extracting tool 11, the parameter extracting apparatus 1 locates multiple lattice points of the lattice constituting the multiple bins. The parameter extracting apparatus 1 extracts a global model parameter (hereinafter referred to as a "global model" as well) for globally reproducing the electronic characteristics of the transistor corresponding to the multiple lattice points. Subsequently, out of the multiple lattice points, the parameter extracting apparatus 1 selects a lattice point to be a target for the model parameter extraction. The following embodiment will be described taking an example in which model parameters are extracted by sequentially increasing the gate length L, starting at a lattice point corresponding to a transistor having the largest gate width W and the smallest gate length L.

In step S102, the parameter extracting apparatus 1 selects a gate width W of the transistor from which the model parameter is to be extracted. In this respect, the parameter extracting apparatus 1 selects a lattice point representing the largest gate width W and the smallest gate length L as a first reference lattice point. In step S103, the parameter extracting apparatus 1 continues carrying out the model parameter extraction by sequentially increasing the gate length L.

In step S104, it is judged whether or not the gate length L of the transistor having the selected gate width W has reached the largest gate length L. When the result of the judgment shows that the gate length L has not reached the largest gate length L, the process returns to Step S103, where the parameter extracting apparatus 1 continues the parameter extraction without shifting from the current gate width W. When the result of the judgment shows that the gate length L has reached the largest gate length L, the process proceeds to step S105.

In step S105, the parameter extracting apparatus 1 changes the gate width W of the transistor from which a model parameter is to be extracted. The parameter extracting apparatus 1 selects a lattice point representing a gate width W smaller than the gate width W corresponding to the lattice point selected in step S102. In this respect, the parameter extracting apparatus 1 selects the lattice point corresponding to the selected gate width W and having the smallest gate length L.

In step S106, referring to information on the lattice points of the lattice constituting the multiple bins, the parameter extracting apparatus 1 judges whether or not there remains a lattice point at which the model parameter extraction has not been completed yet. When the result of the judgment shows that there remains a lattice point at which the model parameter extraction has not been completed yet, the process returns to step S103. When the result of the judgment shows that the model parameter extraction has been completed at all the lattice points, the parameter extracting apparatus 1 terminates the process.

Figure 6:
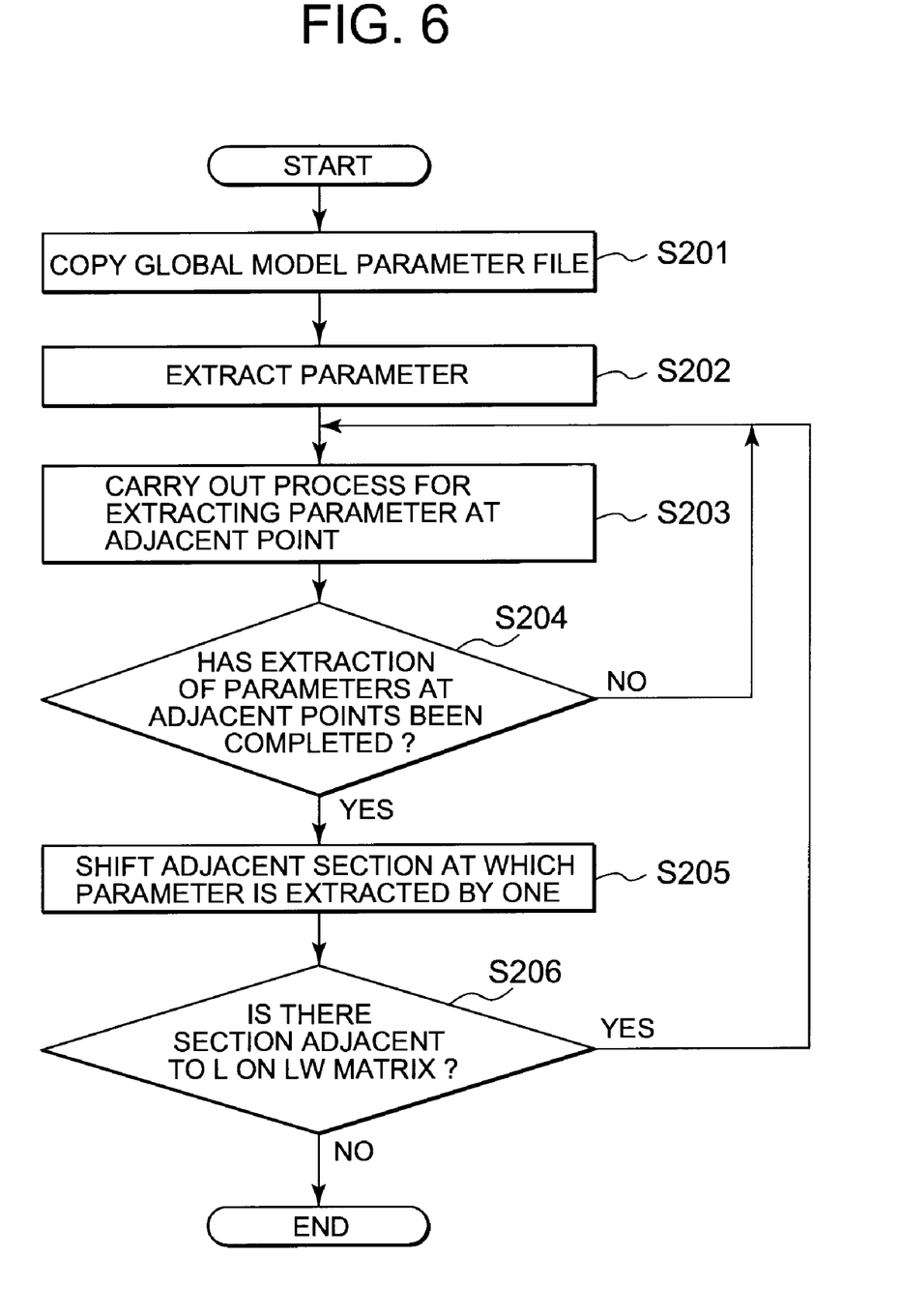
FIG. 6 is a flowchart exemplifying a detailed operation for parameter extraction.

FIG. 6 is a flowchart exemplifying a detailed operation for the process carried out in step S103. FIG. 6 exemplifies the detailed operation for the parameter extraction process which is carried out step-by-step by increasing the gate length L. In step S201, the parameter extracting apparatus 1 copies the global model parameter for use as a basis for the model parameter at the first reference lattice point selected in step S102. In step S202, on the basis of the global model parameter, the model parameter at the reference lattice point is extracted.

In step 203, the model parameters at the respective adjacent points are extracted. In step S204, the parameter extracting apparatus 1 judges whether or not the extraction of the model parameters at the respective adjacent points has been completed. When the result of the judgment shows that the extraction of the model parameters at the respective adjacent points has not been completed yet, the process returns to step S203, where the parameter extracting apparatus 1 continues the model parameter extraction. When the extraction of the model parameters at the respective adjacent points has been completed, the process proceeds to step S205.

In step S205, the parameter extracting apparatus 1 selects an adjacent point as a new reference lattice point. In step S206, the parameter extracting apparatus 1 judges whether or not there is a new adjacent point which is adjacent to the new reference lattice point. When the result of the judgment shows that there is a new adjacent point, the process returns to step S203, where the parameter extracting apparatus 1 extracts a model parameter at the new adjacent point. In a case where there is no new adjacent point, the parameter extracting apparatus 1 terminates the process.

Figure 7:
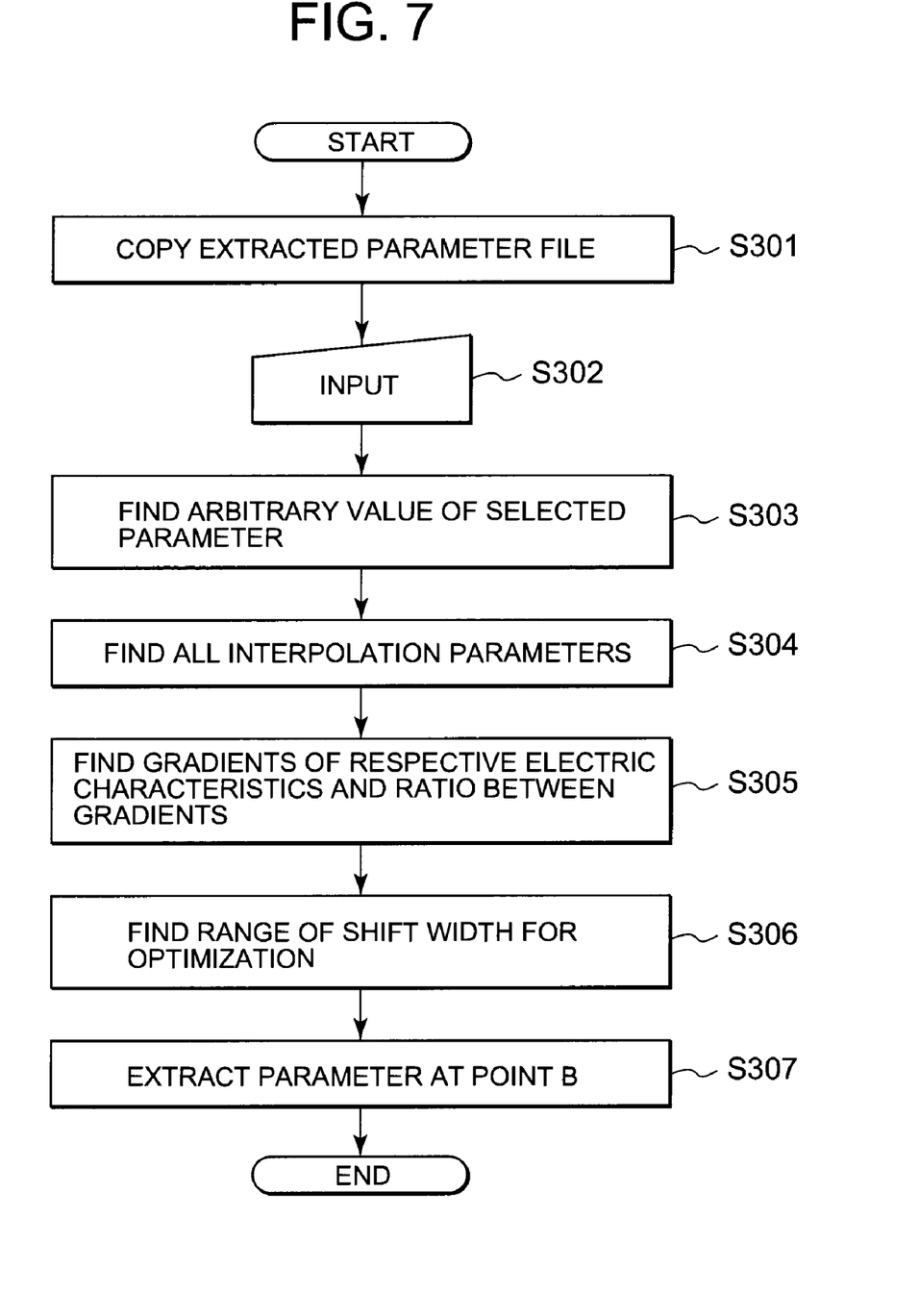
FIG. 7 is a flowchart exemplifying another detailed operation for parameter extraction.
Figure 8:
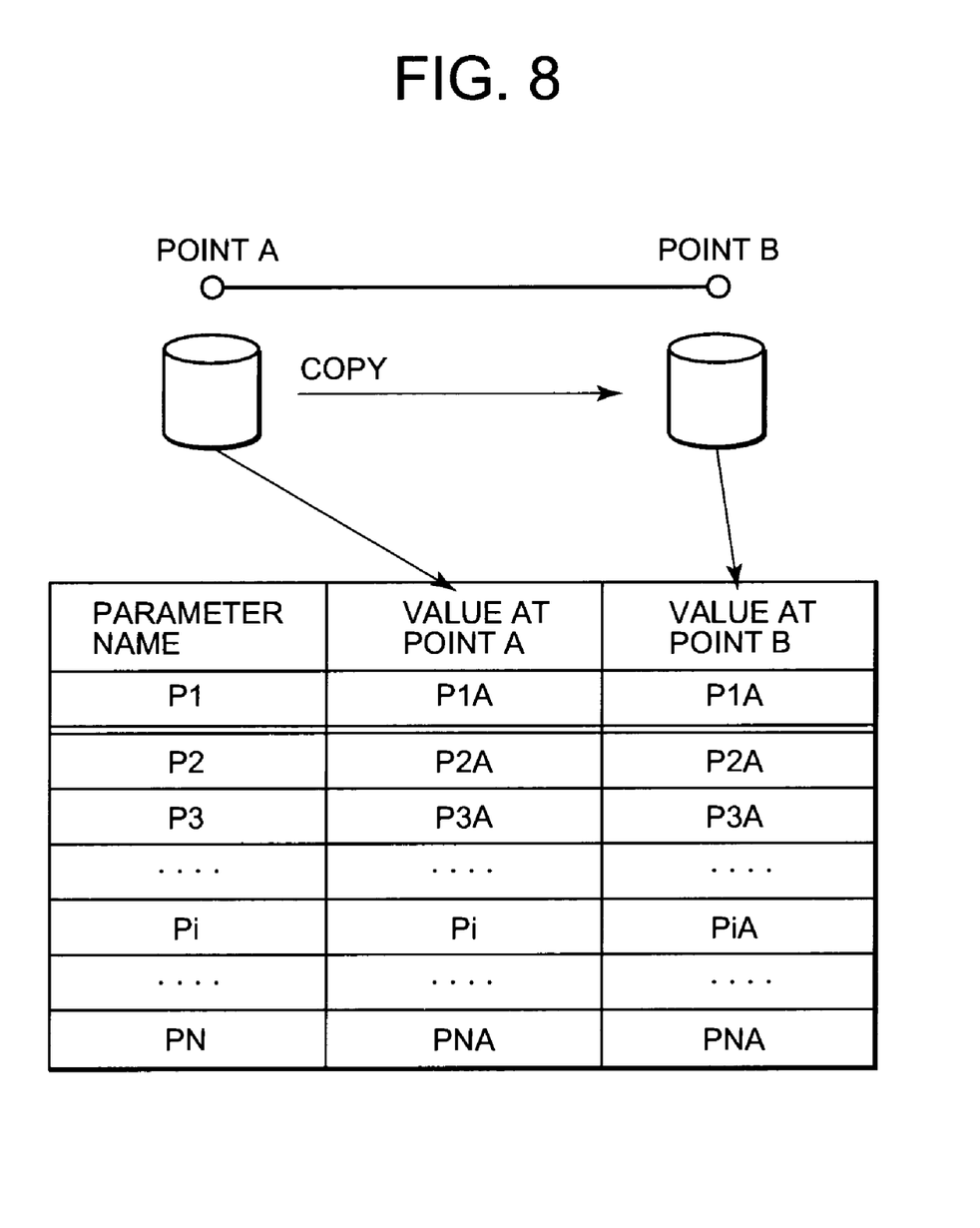
FIG. 8 exemplifies how an extracted parameter file is copied.

FIG. 7 is a flowchart exemplifying a detailed operation which is carried out in step S203, which has been described above. In step S301, the parameter extracting apparatus 1 copies the model parameter extracted corresponding to the reference lattice point, as a model parameter at the adjacent point. FIG. 8 is a diagram exemplifying how the extracted parameter file is copied. FIG. 8 exemplifies an operation carried out when: Point A shown in FIG. 3 described above is selected as the reference lattice point; and Point B adjacent to the Point A is selected as the adjacent point. As shown in FIG. 8, model parameters as extraction targets include a first parameter P1 to an nth parameter PN. In step S301, the model parameter at the reference lattice point and the model parameter at the adjacent point are set at the same value.

Referring back to FIG. 7, in step S302, in response to an operation made by a user, the parameter extracting apparatus 1 selects a parameter. When the model parameters as the extraction targets include the first parameter P1 to the nth parameter PN as described above, the parameter extracting apparatus 1 selects one parameter out of the first parameter P1 to the nth parameter PN in the process in step S302. The following embodiment will be described taking an example in which the second parameter P2 is selected. In step S302, in response to the operation made by the user, a range of a ratio between gradients of the respective tangent lines which is used for the parameter extraction is inputted. The following embodiment will be described taking an example in which the following is set up as the range:

$R\text{Min\_min}$ to $R\text{Min\_max}$

Figure 9:
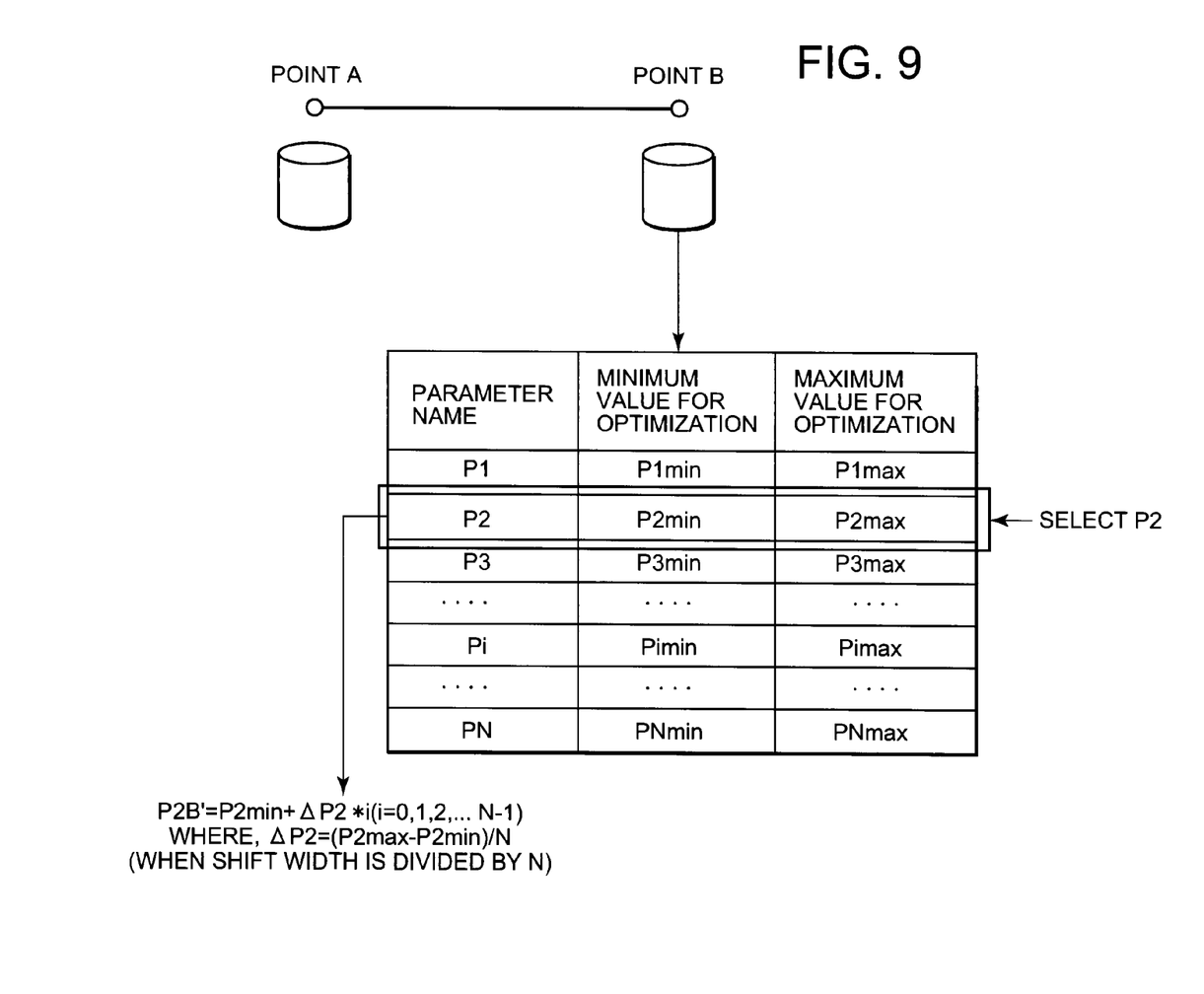
FIG. 9 is a diagram exemplifying how an arbitrary value is found for a selected parameter.

In step S303, the parameter extracting apparatus 1 finds an arbitrary value for the selected parameter. At this time, the parameter extracting apparatus 1 selects a shift width used in optimizing the parameter, and finds the arbitrary value for the parameter within the range. FIG. 9 exemplifies a process in step S303. FIG. 9 shows the process in step S303 which is carried out when the second parameter P2 is selected.

Assume that the arbitrary value is set to a selected adjacent point parameter value P2B' when the largest shift width and the smallest shift width for the second parameter P2 is a shift width maximum value P2max and a shift width minimum value P2min, respectively. When the shift width (from the shift width maximum value P2max to the shift width minimum value P2min) is divided by N, the arbitrary value is found by use of the following equation.

$$P2B' = P2\text{min} + \Delta P2 * i \quad (i=0, 1, 2, \ldots, N-1)$$

where $\Delta P2 = (P2\text{max} - P2\text{min})/N$.

Referring back to FIG. 7, in step S304, the parameter extracting apparatus 1 finds an interpolation parameter which interpolates between the arbitrary value (the selected adjacent point parameter value P2B') and the model parameter at the reference lattice point (Point A). For each of the arbitrary values (the selected adjacent point parameter values P2B'), the parameter extracting apparatus 1 calculates the parameter which interpolates between the reference lattice point (Point A) and the adjacent point (Point B).

Figure 10A:
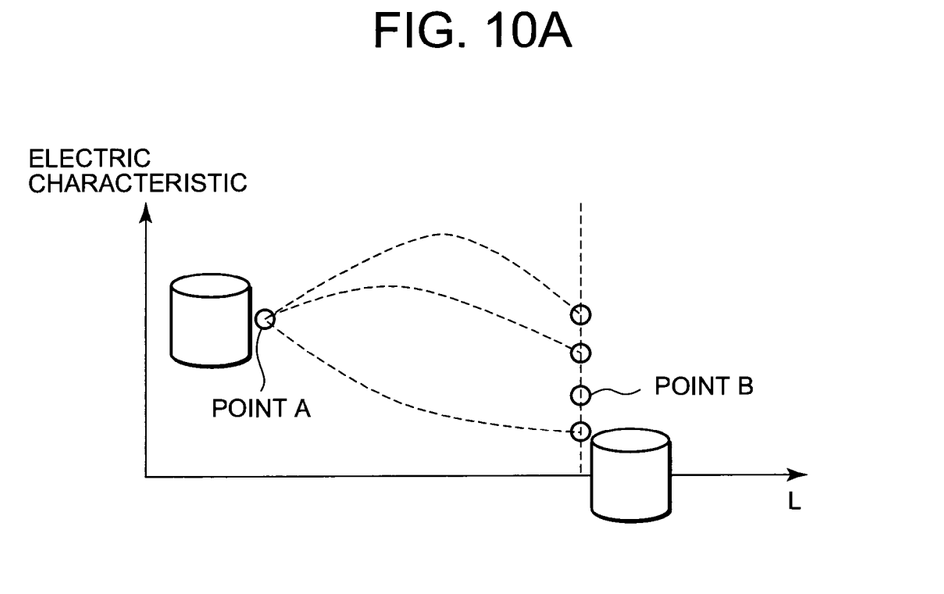
FIG. 10A is a graph showing an electric characteristic which is obtained on the basis of a reference point second parameter value and selected adjacent point parameter values.

FIG. 10A is a graph showing an electric characteristic which is obtained on the basis of the fixed reference point second parameter value P2A and the multiple selected adjacent point parameter values P2B' which are different from one another. As shown in FIG. 10A, the model parameter at the reference lattice point (Point A) is fixed, and the model parameter at the adjacent point (Point B) is changeable corresponding to the selected adjacent point parameter values P2B'. Thereby, the curve representing the electric characteristic changes between the reference lattice point (Point A) and the adjacent point (Point B).

On the basis of the following equations, the parameter extracting apparatus 1 calculates interpolation parameters corresponding to the respective selected adjacent point parameter values P2B' which are obtained in the case where the shift width is divided by N.

$$P2A = P2\_0\_i + P2\_L\_i/LA$$

$$P2B = P2\_0\_i + P2\_L\_i/LB$$

$$(i=0, 1, 2, \ldots, N-1)$$

where LA denotes the gate length at the adjacent lattice point, and LB denotes the gate length at the reference lattice point.

Figure 10B:
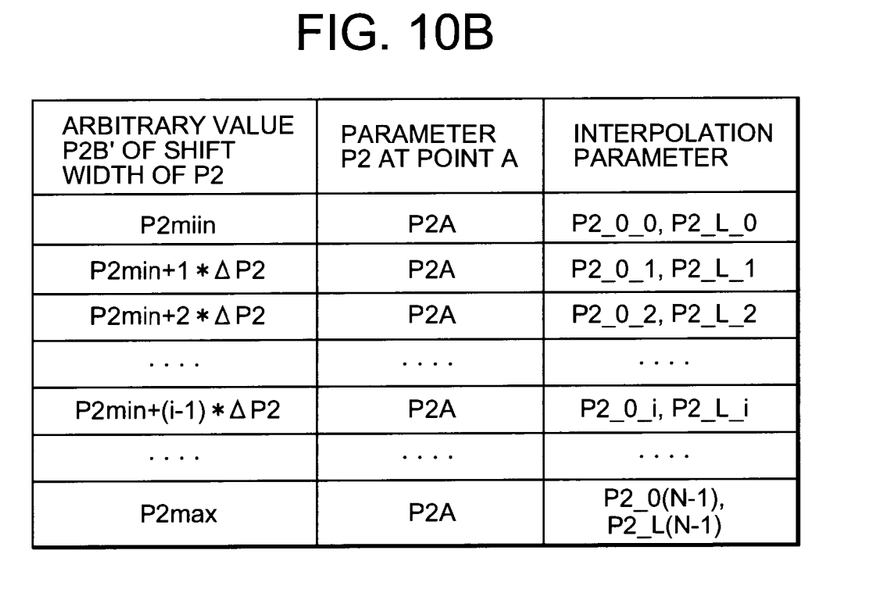
FIG. 10B is a table exemplifying a relationship among the reference point second parameter value, the selected adjacent point parameter values, and interpolation parameters.

The parameter extracting apparatus 1 calculates the interpolation parameters P2_0_i and P2_L_i, using the two equations given above. FIG. 10B is a table exemplifying a relationship among the reference point second parameter value P2A, the selected adjacent point parameter values P2B' and the interpolation parameters. When an interpolation parameter value P2H corresponding to an arbitrary gate length L between the reference lattice point (Point A) and an adjacent point (Point B) is calculated, the second parameter P2 is expressed with $$P2H = P2\_0\_i + P2\_L\_i/L.$$

On the basis of this interpolation parameter value P2H, the parameter extracting apparatus 1 calculates the electric characteristic of the semiconductor device between the reference lattice point (Point A) and the adjacent point (Point B). Thus, the parameter extracting apparatus 1 generates a graph shown in FIG. 10A, which has been described above.

Referring back to FIG. 7, in step S305, for each graph, the parameter extracting apparatus 1 calculates the gradients respectively at the reference lattice point (Point A) and the adjacent point (Point B) as well as the ratio of the gradients. The parameter extracting apparatus 1 selects a graph showing the electric characteristic which has been obtained by the above-mentioned interpolation parameter. On the basis of the form of the curve representing the selected graph, the parameter extracting apparatus 1 generates a tangent line at the reference lattice point (Point A) and a tangent line at the adjacent point (Point B). In addition, the parameter extracting apparatus 1 finds the ratio between the gradients of the respective generated tangent lines, for each of the multiple graphs.

Figure 11A:
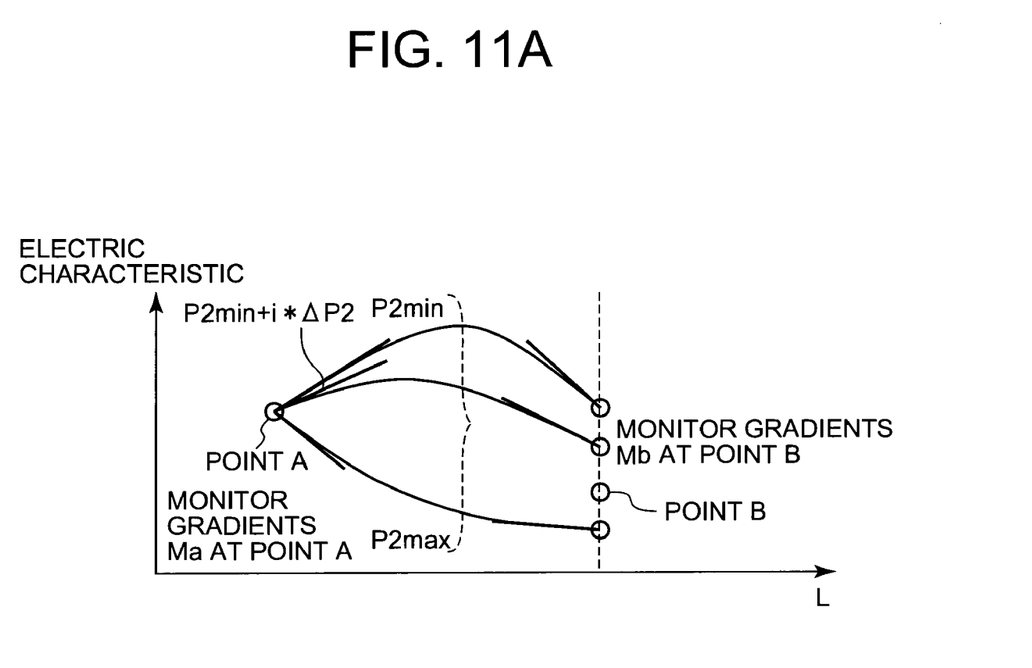
FIG. 11A is a graph exemplifying tangent lines which are generated at a reference lattice point (Point A) and an adjacent point (Point B), respectively.

FIG. 11A is a graph exemplifying tangent lines generated at the reference lattice point (Point A) and the adjacent point (Point B). As shown in FIG. 11A, the form of the curve representing the electric characteristic between the reference lattice point (Point A) and the adjacent point (Point B) changes in the case where: the model parameter at the reference lattice point (Point A) is fixed; and the model parameter at the adjacent point (Point B) is changeable corresponding to the selected adjacent point parameter values P2B'. The gradients of the respective tangent lines also change depending on the change in the form of the curve.

Figure 11B:
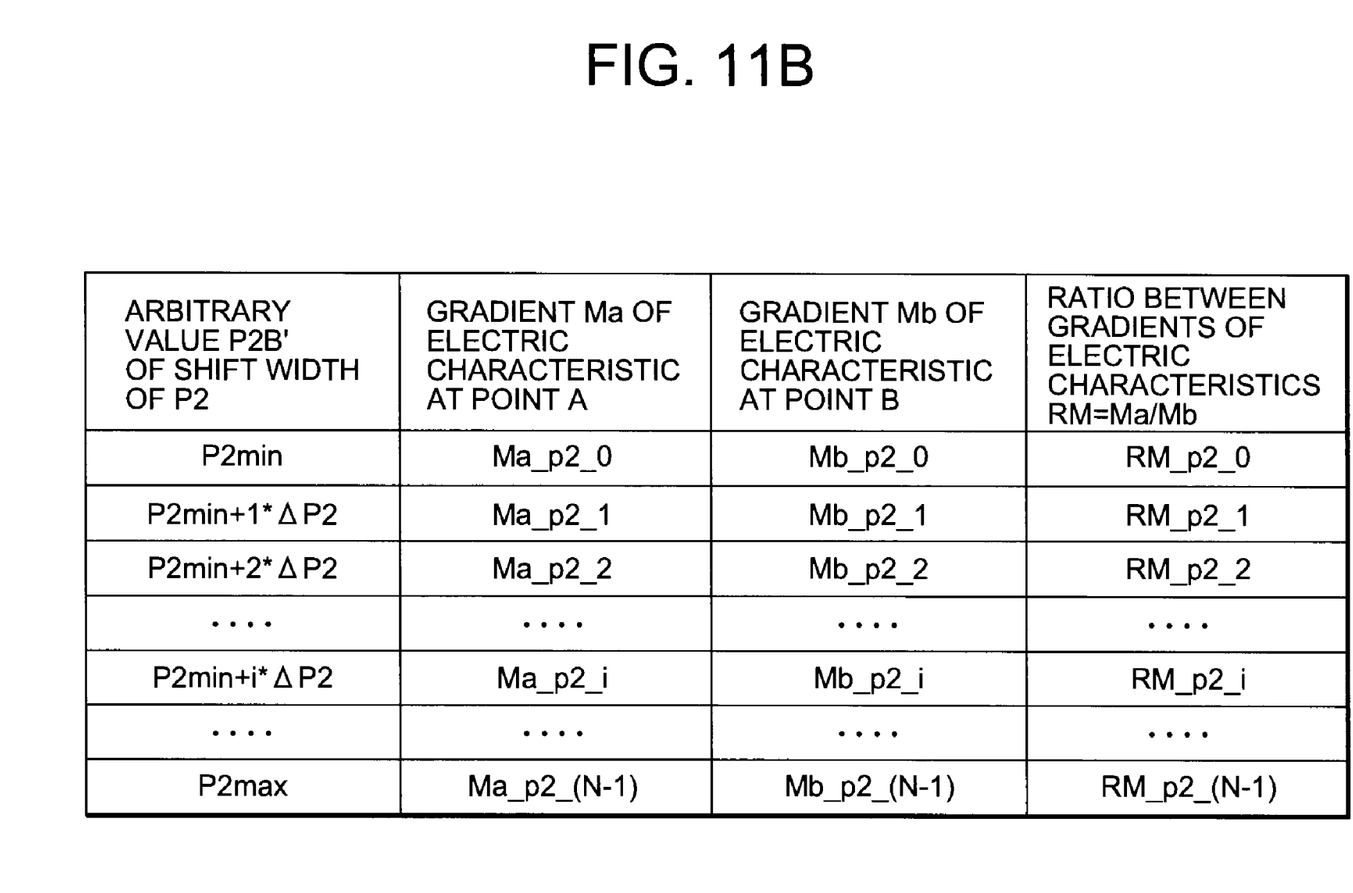
FIG. 11B is a table exemplifying a relationship between gradients and a ratio between the gradients for each graph.

FIG. 11B is a table exemplifying a relationship among the selected adjacent point parameter value P2B', the gradients of the respective graphs at the reference lattice point, the gradients of the respective graphs at the adjacent point, and the ratios between the gradients at the reference lattice point and the corresponding gradients at the adjacent point. As shown in FIG. 11B, on the basis of all the graphs generated corresponding to the respective selected adjacent point parameter values P2B', the parameter extracting apparatus 1 calculates the gradients Ma, the gradients Mb and the ratios RM between the gradients Ma and the corresponding gradients Mb.

Referring back to FIG. 7, in step S306, the parameter extracting apparatus 1 determines a shift width being the range for optimizing the model parameter at the adjacent point (Point B). The parameter extracting apparatus 1 compares the beforehand-received range $$RMin\_min \text{ to } RMin\_max$$

of the ratio between the gradients of the respective tangent lines with the gradient ratios RM shown in the table of FIG. 11B, which has been described above. The parameter extracting apparatus 1 seeks out a selected adjacent point parameter value P2B' corresponding to a gradient ratio RM which falls within the range expressed with $$RMin\_min \text{ to } RMin\_max.$$

In step S307, the parameter extracting apparatus 1 treats a value represented by the selected adjacent point parameter value P2B' thus sought out, as the optimized range for the second parameter P2 at the adjacent point (Point B). Thus, the parameter extracting apparatus 1 extracts a model parameter agreeing with the electric characteristic of the semiconductor device which corresponds to the adjacent point (Point B).

In the present embodiment, as described above, the parameter extracting apparatus 1 extracts the model parameter by employing the gradients at the two points on each graph representing the electric characteristic, and thus carries out the parameter extraction so that the ratio of the gradients may be reduced. Thereby, the parameter extracting apparatus 1 is capable of predicting whether or not the device model has a deflection of the electric characteristic, and is accordingly capable of carrying out the parameter extraction on the basis of the prediction.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A model parameter extracting apparatus comprising:
   a binning processor configured to carry out a binning process for limiting an effective range of a semiconductor device model used in a circuit simulation; and
   a model parameter extractor configured to extract a model parameter used in the circuit simulation, for each of a plurality of bins formed by the binning process,
   wherein
   the model parameter extractor selects one of the plurality of bins as a target bin,
   the model parameter extractor extracts a first model parameter for predicting an electric characteristic of a semiconductor device at a first end portion of the target bin,
   based on the first model parameter, the model parameter extractor sets up a candidate for a second model parameter for predicting an electric characteristic of the semiconductor device at a second end portion of the target bin,
   based on the first model parameter and the candidate for the second model parameter, the model parameter extractor calculates a limited curve representing the electric characteristic of the semiconductor device,
   the model parameter extractor finds a start-point-side gradient representing a gradient of a tangent line of the limited curve including a start point; and an end-point-side gradient representing a gradient of a tangent line of the limited curve including an end point, and
   based on a result of a comparison between the start-point-side gradient and the end-point-side gradient, the model parameter extractor extracts the second model parameter.

2. The model parameter extracting apparatus according to claim 1, wherein
   the model parameter extractor sets up a plurality of candidate parameters as the candidates for the second model parameter,
   for the respective plurality of candidate parameters, the model parameter extractor generates a plurality of graphs, each representing an electric characteristic of the semiconductor device at an intermediate portion between the first end portion and the second end portion, based on a result of a comparison between the start-point-side gradient and the end-point-side gradient of each of the plurality of graphs, the model parameter extractor determines a range from which to extract the second model parameter, and the model parameter extractor extracts the second model parameter within the range thus determined.

3. The model parameter extracting apparatus according to claim 2, wherein based on the result of the comparison, the model parameter extractor holds allowable range information to be referred to when the range from which to extract the second model parameter is determined, and based on information obtained from the result of the comparison and on the allowable range information, the model parameter extractor determines the range from which to extract the second model parameter.

4. The model parameter extracting apparatus according to claim 3, wherein the model parameter extractor receives setup range information indicative of a range of the plurality of candidate parameters, and thus sets up the plurality of candidate parameters one-by-one on the basis of the setup range information, the model parameter extractor calculates an interpolation parameter for interpolating between each of the plurality of candidate parameters and the first model parameter, based on the interpolation parameters respectively corresponding to the plurality of candidate parameters, the model parameter extractor generates a plurality of the limited curves, respectively, and for each of the plurality of limited curves, the model parameter extractor finds the start-point-side gradient and the end-point-side gradient, and thus determines a range suitable for optimizing the second model parameter.

5. The model parameter extracting apparatus according to claim 3, wherein the model parameter extractor receives gradient range information as the allowable range information, the gradient range information indicating a range of a difference between the start-point-side gradient and the end-point-side gradient, and based on the result of the comparison and the gradient range information, the model parameter extractor determines the range suitable for optimizing the second model parameter.

6. The model parameter extracting apparatus according to claim 1, wherein before extracting the first model parameter, the model parameter extractor extracts a global model parameter for reproducing the characteristic of the semiconductor device for all the plurality of bins, and the model parameter extractor extracts the first model parameter on the basis of the global model parameter.

7. The model parameter extracting apparatus according to claim 1, wherein the model parameter extractor uses the second model parameter as a new first model parameter, the model parameter extractor selects a bin adjacent to the target bin as a new target bin, and on the basis of the new target bin and the new first model parameter, the model parameter extractor extracts a new second model parameter.

8. The model parameter extracting apparatus according to claim 7, wherein the binning processor forms the plurality of bins in such a manner that the distribution is divided in a matrix, and the model parameter extractor sequentially selects a new target bin from bins arrayed in a first row of the matrix, and if there is no new target bin yet to be selected from the first row of the matrix, the model parameter extractor extracts the first model parameter and the second model parameter for each of bins arrayed in a second row of the matrix.

9. A non-transitory computer-readable storage medium storing a model parameter extracting program instructing a procedure for causing a computer to function as a model parameter extracting apparatus for extracting a model parameter used in a circuit simulation for predicting an electric characteristic of a semiconductor device, the program, when executed by the computer, performing steps comprising:

a binning processing step of carrying out a binning process for limiting an effective range of a semiconductor device model used in the circuit simulation; and a model parameter extracting step of extracting the model parameter used in the circuit simulation, for each of a plurality of bins formed by the binning process, wherein the model parameter extracting step comprises the steps of:

(a) selecting one of the plurality of bins as a target bin, and thus extracting a first model parameter for predicting an electric characteristic of the semiconductor device at a first end portion of the target bin;

(b) based on the first model parameter, setting up a candidate for a second model parameter for predicting the electric characteristic of the semiconductor device at a second end portion of the target bin;

(c) based on the first model parameter and the candidate for the second model parameter, calculating a limited curve representing the electric characteristic of the semiconductor device;

(d) finding a start-point-side gradient representing a gradient of a tangent line of the limited curve including a start point, and an end-point-side gradient representing a gradient of a tangent line of the limited curve including an end point; and (e) on the basis of a result of a comparison between the start-point-side gradient and the end-point-side gradient, extracting the second model parameter.

10. The non-transitory computer-readable storage medium according to claim 9, wherein the step (c) includes the steps of:

setting up a plurality of candidate parameters as the candidates for the second model parameter; and for the respective plurality of candidate parameters, generating a plurality of graphs, each representing an electric characteristic of the semiconductor device at an intermediate portion between the first end portion and the second end portion, and the step (e) includes the steps of:

based on a result of a comparison between the start-point-side gradient and the end-point-side gradient of each of the plurality of graphs, determining a range from which to extract the second model parameter; and extracting the second model parameter within the range thus determined.

11. The non-transitory computer-readable storage medium according to claim 10, wherein the step (e) includes the steps of:

based on the result of the comparison, reading allowable range information to be referred to when the range from which to extract the second model parameter is determined; and based on information obtained from the result of the comparison and on the allowable range information, determining the range from which to extract the second model parameter.

12. The non-transitory computer-readable storage medium according to claim 11, wherein the step (c) further includes the steps of:

receiving setup range information indicative of a range of the plurality of candidate parameters, and thus setting up the plurality of candidate parameters step-by-step on the basis of the setup range information;

calculating an interpolation parameter for interpolating between each of the plurality of candidate parameters and the first model parameter; and based on the interpolation parameters respectively corresponding to the plurality of candidate parameters, generating a plurality of the limited curves, respectively, and the step (e) further includes a step of, for each of the plurality of limited curves, finding the start-point-side gradient and the end-point-side gradient, and thus determining a range suitable for optimizing the second model parameter.

13. The non-transitory computer-readable storage medium according to claim 11, wherein the step (e) includes the steps of:

receiving gradient range information as the allowable range information, the gradient range information indicating a range of a difference between the start-point-side gradient and the end-point-side gradient; and based on the result of the comparison and the gradient range information, determining the range suitable for optimizing the second model parameter.

14. The non-transitory computer-readable storage medium according to claim 9, further comprising a step of, before extracting the first model parameter, extracting a global model parameter for reproducing the characteristic of the semiconductor device for all the plurality of bins, wherein the step (a) includes a step of extracting the first model parameter on the basis of the global model parameter.

15. The non-transitory computer-readable storage medium according to claim 9, further comprising the steps of:

(g) using the second model parameter as a new first model parameter, and a bin adjacent to the target bin as a new target bin; and (h) based on the new target bin and the new first model parameter, extracting a new second model parameter.

16. The non-transitory computer-readable storage medium according to claim 15, wherein the binning processing step includes a step of forming the plurality of bins in such a manner that the distribution is divided in a matrix, the step (g) includes a step of sequentially selecting the new target bin from bins arrayed in a first row of the matrix, the step (h) includes a step of if there is no new target bin yet to be selected from the first row of the matrix, the model parameter extractor, extracting the first model parameter and the second model parameter for each of bins arrayed in a second row of the matrix.

\* \* \* \* \*